United States Patent
Asakawa

(10) Patent No.: US 7,039,488 B2
(45) Date of Patent: May 2, 2006

(54) METHOD OF DETERMINING REMAINING FILM THICKNESS IN POLISHING PROCESS

(75) Inventor: Kazuhiko Asakawa, Miyagi (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 55 days.

(21) Appl. No.: 10/768,076

(22) Filed: Feb. 2, 2004

(65) Prior Publication Data

US 2005/0080506 A1 Apr. 14, 2005

(30) Foreign Application Priority Data

Oct. 10, 2003 (JP) .............................. 2003-352474

(51) Int. Cl.
*G06F 19/00* (2006.01)
*H01L 21/302* (2006.01)

(52) U.S. Cl. ..................... 700/121; 700/164; 438/692; 451/29

(58) Field of Classification Search ................ 700/121, 700/164; 438/14, 692, 697, 945, 717; 451/29, 451/30; 257/258, E21.244

See application file for complete search history.

(56) References Cited

U.S. PATENT DOCUMENTS

| 6,690,045 B1 * | 2/2004 | Shinkawata ............... 257/258 |
| 6,905,966 B1 * | 6/2005 | Morita ...................... 438/692 |
| 2004/0121613 A1 * | 6/2004 | Morita ...................... 438/717 |

FOREIGN PATENT DOCUMENTS

| JP | 2002-140655 | 5/2002 |
| JP | 2002-342399 | 11/2002 |

* cited by examiner

*Primary Examiner*—Leo Picard
*Assistant Examiner*—Steven R. Garland
(74) *Attorney, Agent, or Firm*—Volentine Francos & Whitt, PLLC

(57) ABSTRACT

A method of determining remaining film thickness in polishing process provides a technology for controlling a polishing amount of CMP in a device isolating process with satisfactory accuracy regardless of the ratio between the area of each of device forming regions and that of each of trench regions, the type of abrasive, etc.

10 Claims, 9 Drawing Sheets

US 7,039,488 B2

METHOD OF DETERMINING REMAINING FILM THICKNESS IN POLISHING PROCESS

BACKGROUND OF THE INVENTION

1. Field of the Invention

The present invention relates to a technology for performing device isolation of a semiconductor device by using a CMP (Chemical Mechanical Polishing) method.

2. Description of the Related Art

As a device isolation technique used for a semiconductor device, there has been known, for example, an STI (Shallow Trench Isolation) technology. In the STI technology, device isolation is carried out by shallow trenches defined in the surface of a semiconductor substrate.

One example of a device isolating process using the STI technology will be explained below with reference to FIGS. 8A–8D and 9A–9B.

(1) A protective oxide film 802 having a thickness of about 15 nm is formed on the surface of a silicon substrate 801. Subsequently, a silicon nitride (SiN) film 803 is formed on the surface of the protective oxide film 802 by, for example, an LPCVD (Low Pressure Chemical Vapor Deposition) method. Further, resist patterns 804 are formed on a device forming region of the silicon nitride film 803 by using a normal photolithography technology (see FIG. 8(A)).

(2) Dry etching using the resist patterns 804 as masks is effected to sequentially etch the silicon nitride film 803, the protective oxide film 802 and the silicon substrate 801, thereby forming trenches 805. Thereafter, the resist patterns 804 are removed (see FIG. 8(B)).

(3) A rounding oxidizing treatment is effected on inner wall surfaces of the trenches 805. Consequently, oxide films 806 are formed. The oxide films 806 make it possible to prevent damage to the inner wall surfaces, the occurrence of crystal defects and contamination at the time that an oxide film 807 is formed in a subsequent process. Further, since the corners of upper ends of the trenches 805 can be rounded by the corresponding oxide films 806, the oxide film 807 can be formed on the corners with no clearance.

(4) Next, the oxide film 807 is formed by, for example, a CVD (Chemical Vapor Deposition) method. Thus, the oxide film 807 is charged into the trenches 805 and covers the surface of the silicon nitride film 803 (see FIG. 8(C)).

(5) Subsequently, the CVD oxide film 807 is polished by the CMP method until the surface of the silicon nitride film 803 is exposed (see FIG. 8(D)). As an abrasive, for example, a silica slurry (abrasive containing grinding particles, which is made of a silica material) can be used.

(6) Afterwards, the surface of the CVD oxide film 807 is etched in such a manner that the upper surface of the CVD oxide film 807 becomes close to the surface of the silicon substrate 801 (see FIG. 9(A)).

(7) Then, the silicon nitride film 803 is removed using a solution of thermal phosphoric acid and the protective oxide film 802 is removed using hydrofluoric acid (see FIG. 9(B)).

Here, it is important to control the amount of polishing by a CMP process step (see above process step (5)) with high accuracy with a view toward improving yields and reliability of the semiconductor device.

However, it was very difficult to control the polishing amount of CMP with high accuracy. This is because the polishing speed of CMP in a given region on the silicon substrate 801 depends not only on underlying conditions in a region to be polished but also on underlying conditions in a region around the polished region. Therefore, the section of the silicon substrate 801 has heretofore been analyzed after the CMP process step by use of an SEM (Scanning Electron Microscope). However, although the method for analyzing the section by the SEM is capable of accurately recognizing the remaining film thickness of the silicon nitride film 803, it causes a breakdown in the silicon substrate 801 and needs a large number of processes and much time for analysis.

The dependence of the polishing speed on the underlying base can also be reduced to some extent by using a CeO (cesium oxide, i.e., ceria) slurry as an abrasive. However, when a region in which an active pattern density (proportion of area occupied by device forming regions) is extremely small, exists, it becomes difficult to control the accurate remaining film thickness of the silicon nitride film 803 in reverse. This is because when the ceria slurry is used, the polishing speed becomes very fast. Therefore, there is a possibility that the silicon nitride film 803 will disappear perfectly in the region in which the active pattern density is extremely small. Due to such a reason, a semiconductor integrated circuit should be designed in such a manner that the region in which the active pattern density is extremely small, does not exist when the ceria slurry is used. However, the addition of such a design condition will increase the load on design. Additionally, only the appropriateness of the design condition might encounter difficulties in controlling the polishing amount of CMP with high accuracy.

As a technology for improving the polishing accuracy of CMP, there have heretofore been known ones disclosed in, for example, the following patent documents 1 and 2. However, both of these show techniques aimed at improving the polishing accuracy when a film formed on wiring patterns is planarized by CMP. It is difficult to apply the present technique to a device isolating process. In the following patent documents 1 and 2, dummy patterns are formed to improve the smoothness of the film formed on the wiring patterns. Thus, when one attempts to apply the technologies of the patent documents 1 and 2 to the above-described device isolating processes (see FIGS. 8 and 9), dummy trenches are eventually formed. However, the formation of the dummy trenches will incur degradation of the rate of integration of the semiconductor device and an increase in complexity, thus resulting in unreality.

Japanese Unexamined Patent Publication No. 2002-140655
Japanese Unexamined Patent Publication No. 2002-342399

SUMMARY OF THE INVENTION

The present invention has been made in view of the above problems. It is therefore an object of the present invention to provide a technology for controlling a polishing amount of CMP in a device isolating process with satisfactory accuracy regardless of the ratio between the area of each of device forming regions and that of each of trench regions, the type of abrasive, etc.

A remaining film thickness determining method employed in a polishing process, according to a first invention comprises:

a measuring process including,
a first step for forming a predetermined coated film on a semiconductor substrate;
a second step for forming on the coated film resist patterns each having a plurality of line/space pattern blocks in which at least one of line widths and space widths are different from one another;
a third step for etching the surfaces of the coated film and the semiconductor substrate with the resist patterns as masks to thereby form trenches;

a fourth step for removing the resist patterns and thereafter forming a buried insulating film which charges the interiors of the trenches and covers the surface of the coated film;

a fifth step for polishing the surface of the buried insulating film so as to expose the surface of the coated film; and a sixth step for measuring remaining film thicknesses of the coated film subsequent to the fifth step, at a plurality of measuring points; and a computing process including, a seventh step for conceptually defining reference regions each having a predetermined shape and area in the surface of the semiconductor substrate such that each of the measuring points is placed in the center thereof;

an eighth step for computing a ratio between an area of the reference region and a gross area of the lines lying in the reference region;

a ninth step for determining a relationship between a result of measurement in the sixth step and a result of computation in the eighth step; and a tenth step for determining an anticipated remaining film thickness of the coated film at an arbitrary point of an actually fabricated semiconductor device on the basis of the relationship determined in the ninth step.

A method of manufacturing a semiconductor device, according to a second invention comprises the following steps:

a first step for forming a coated film on a semiconductor substrate;

a second step for forming resist patterns on the coated film;

a third step for etching the surfaces of the coated film and the semiconductor substrate with the resist patterns as masks to thereby form trenches;

a fourth step for removing the resist patterns and thereafter forming a buried insulating film which charges the interiors of the trenches and covers the surface of the coated film;

a fifth step for determining an anticipated remaining film thickness subsequent to a polishing process, of the coated film by using a predetermined determining method;

a sixth step for forming polish suppressing films in specific regions in each of which it is determined in the fifth step that the remaining film thickness of the coated film becomes smaller than a predetermined film thickness; and a seventh step for polishing the buried insulating film and the polish suppressing films such that the surface of the coated film is exposed.

According to the first invention, reference regions each having a predetermined shape and area can be defined. The remaining film thickness can be determined using the ratio between the area of the reference region and the gross area of lines. Thus, since the remaining film thickness is determined plus an area ratio of regions around measuring pads in addition to layout positions (i.e., points to be determined) of the measuring pads, an accurate judgement on the remaining film thickness is enabled.

According to the second invention, since polish suppressing films are formed in a region in which the result of determination of the remaining film thickness in a polishing process is smaller than a predetermined film thickness, the remaining film thickness of a coated film can be highly accurately controlled by mere addition of a simple process.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
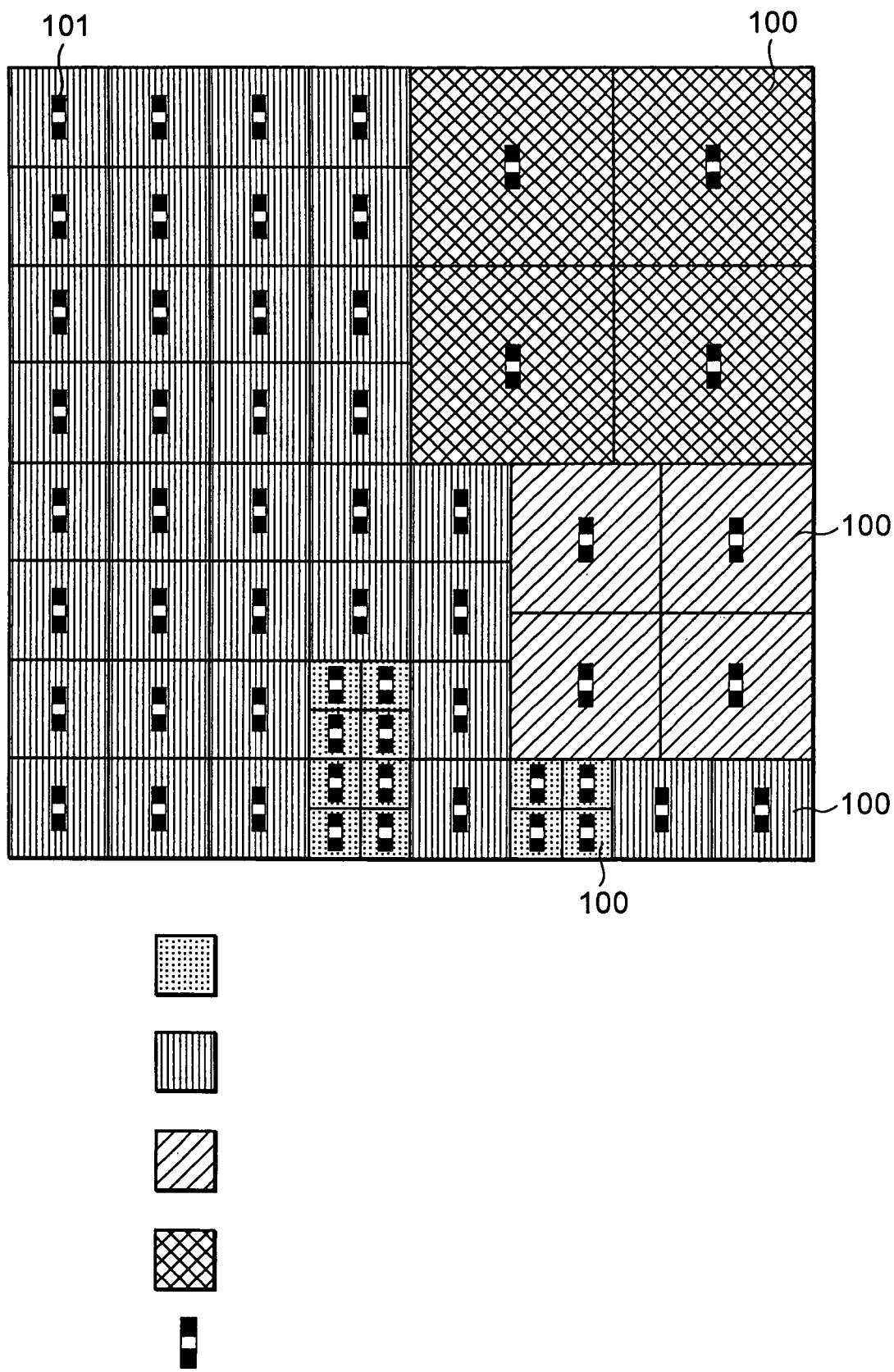
FIG. 1 is a plan view conceptually showing a structure of a TEG pattern according to a first embodiment of the present invention.

Preferred embodiments of the present invention will be described hereinbelow with reference to the accompanying drawings. Incidentally, the sizes, shapes and layout relationship of respective components in the drawings are merely roughly shown to such a degree that the present invention can be understood. Also numerical conditions to be described below are mere illustrations.

<First Embodiment>

One embodiment of a method for determining the remaining film thickness, according to a first invention will first be explained with reference to FIGS. 1 through 4.

The remaining film thickness determining method according to the present embodiment includes a measuring process and a computing method.

In the measuring process, a semiconductor substrate having a TEG (Test Element Group) pattern constituted by trenches and device forming regions is fabricated and the remaining film thickness of a silicon nitride film (to be described later) is measured. FIG. 1 is a plan view conceptually showing the TEG pattern (corresponding to one die).

As shown in FIG. 1, the TEG pattern is divided into a number of blocks 100, 100, . . . In the embodiment shown in FIG. 1, the number of blocks is 56. These blocks 100 respectively have repetitive patterns of lines/spaces. Although the blocks 100 of four types of sizes are provided in the embodiment of FIG. 1, two to three types of sizes or five or more types of sizes may be adopted. The sizes of these blocks 100 are respectively arbitrary. Even if the blocks 100 identical in size are used, line/space patterns do not basically coincide in line width and space width (the same ones may partly be taken). While the line width and space width of each block 100 are optional, they are determined such that various active pattern densities (each corresponding to the proportion of area occupied by each device forming region) are obtained in a computing process (to be described later). Measuring point patterns 101 are provided within the respective blocks 100. The measuring point patterns become measuring positions used upon defining or specifying measuring points of the remaining film thicknesses of the silicon nitride film (to be described later). The size of the measuring point pattern 101 is 80 µm×80 µm, for example.

A process for generating the TEG pattern, i.e., the measuring process according to the present embodiment will next be explained using FIGS. 2A–2D.

(1) A protective oxide film 202 having a thickness of about 15 nm is first formed on the surface of a silicon substrate 201. Further, a silicon nitride film 203 is formed on the surface of the protective oxide film 202 by use of an LPCVD method, for example. These films 202 and 203 correspond to "coated films" employed in the present invention. Subsequently, resist patterns 204 are formed on the surface of the silicon nitride film 203 by using the normal photolithography technology (see FIG. 2(A)). The resist patterns 204 are respectively formed corresponding to line portions of the above-described TEG pattern (see FIG. 1) and the measuring point patterns 101.

(2) Next, the silicon nitride film 203, the protective oxide film 202 and the silicon substrate 201 are sequentially etched using dry etching employing the resist patterns 204 as mask to thereby form trenches 205. Owing to such etching, portions of the silicon substrate 201, which are covered with the resist patterns 204, result in the line portions of the TEG pattern, whereas portions uncovered therewith result in space portions, i.e., trenches. Simultaneously with it, measuring point patterns 101 are also formed. Thereafter, the resist patterns 204 are removed (see FIG. 2(B)).

(3) Oxide films 206 are formed on their corresponding inner wall surfaces of the trenches 205 by a rounding oxidizing treatment.

(4) Subsequently, an oxide film 207 is formed by a CVD method, for example. Thus, the oxide film 207 is charged into the trenches 205 and covers the surface of the silicon nitride film 203 (see FIG. 2(C)). The oxide film 207 corresponds to "a buried insulating film" employed in the present invention.

Figure 2A:
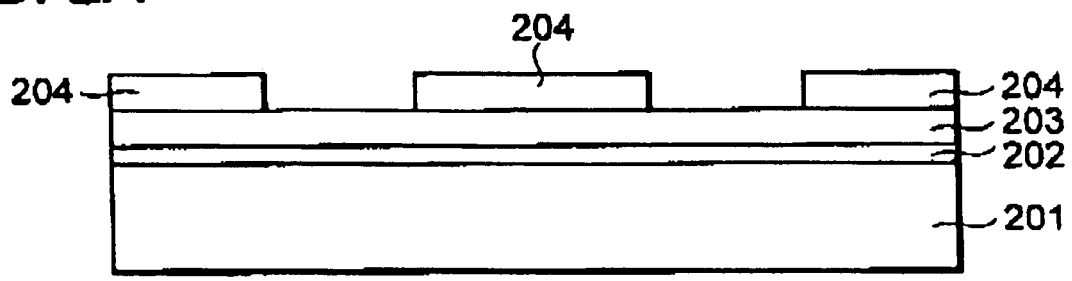
FIGS. 2A–2D are process section views illustrating a measuring process according to the first embodiment.
Figure 2B:
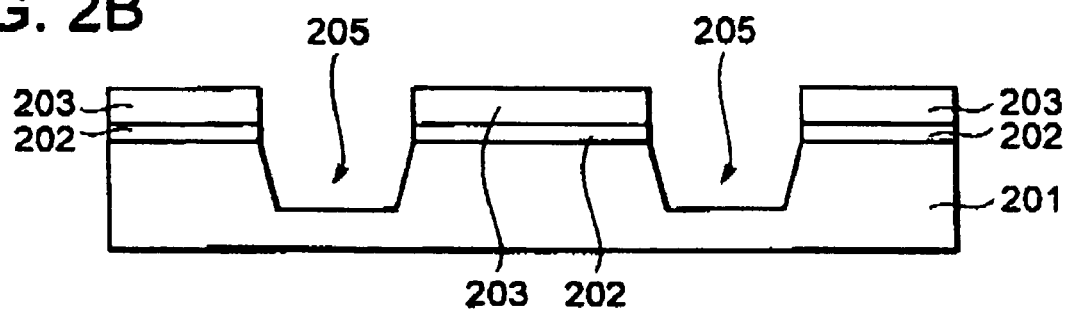
Figure 2C:
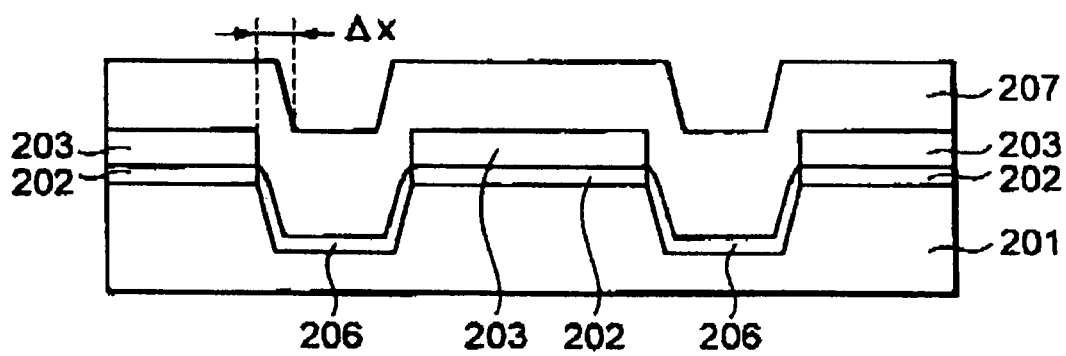
Figure 2D:
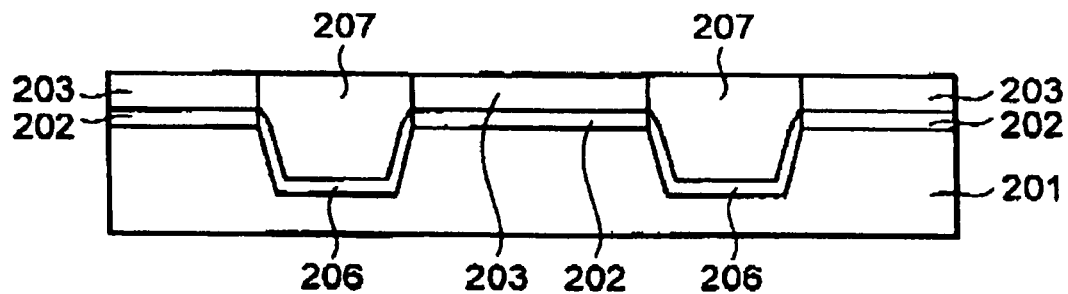

(5) Following the above, the CVD oxide film 207 is polished using a CMP method until the surface of the silicon nitride film 203 is exposed (see FIG. 2(D)). As an abrasive, for example, a ceria slurry can be used.

(6) Thereafter, the remaining film thickness of the silicon nitride film 203 is measured using the known film thickness measuring technology (e.g., the aforementioned sectional SEM). As described above, the respective measuring point patterns 101 become measuring points in the case of such a measurement.

According to the above process steps, such a TEG pattern as shown in FIG. 1 is formed as patterns (corresponding to the line patterns) for the device forming regions and patterns (corresponding to the space patterns) for the trenches.

The computing process according to the present embodiment will next be described using FIG. 3.

Figure 3:
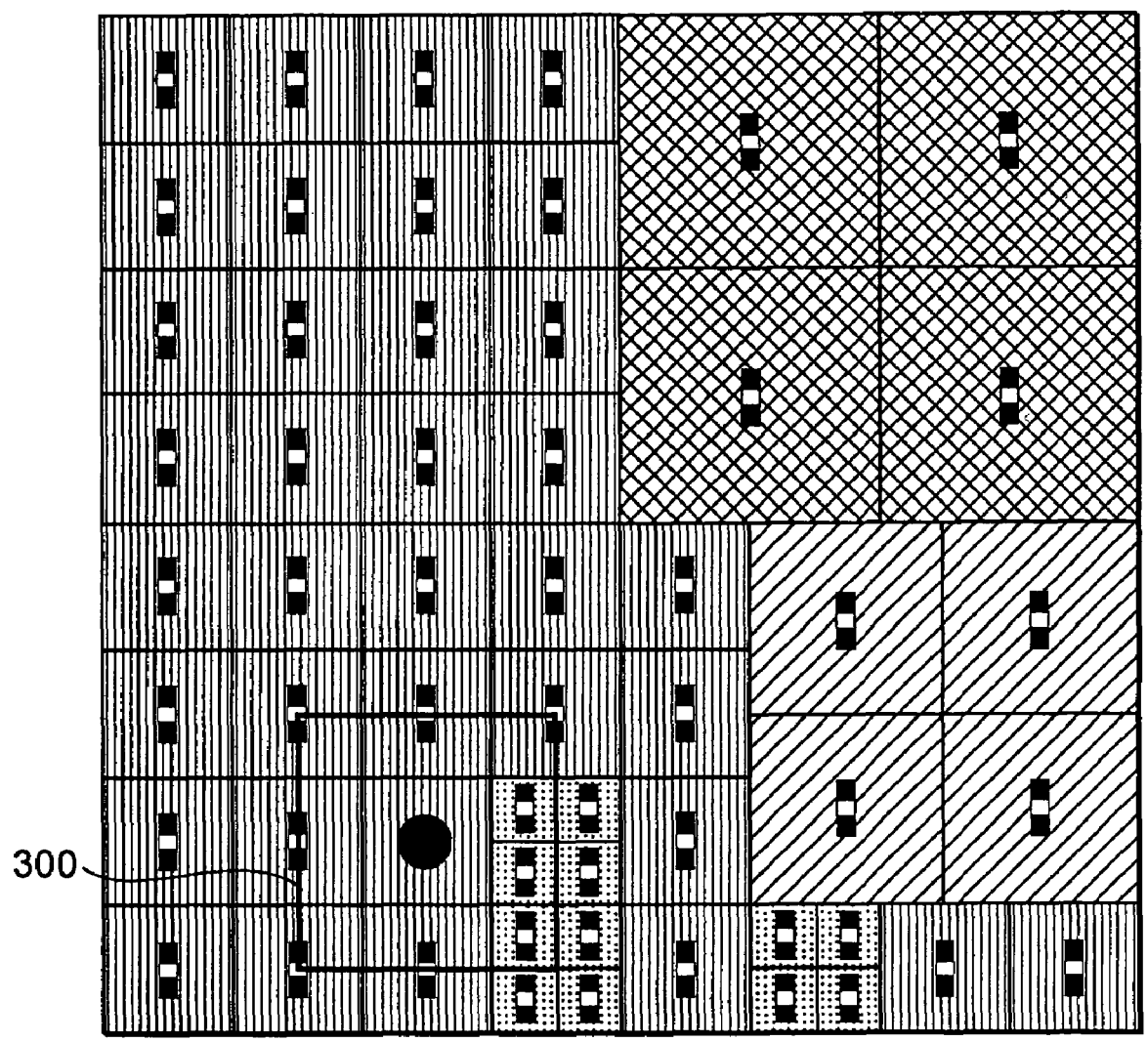
FIG. 3 is a plan view for describing a computing process according to the first embodiment.

(7) Such a reference region 300 as shown in FIG. 3 is first conceptually defined. The size of the reference region 300 is given as 4 mm×4 mm, for example. Each of the reference regions 300 is conceptually disposed in such a manner that the center point of the reference region 300 coincides with each of the measuring point patterns 101. In the embodiment shown in FIG. 3, the reference region 300 is defined so as to become larger than most TEG pattern blocks 100. Consequently, the proportions of areas occupied by the line patterns, which are given as various values, are obtained. The area of the reference region 300 is hereinafter called a reference area A.

(8) Next, a sizing process is effected on a device forming region (portion of each line pattern) lying within the reference region 300. The widths of depressions and projections of the CVD oxide film 207 formed in the process step (4) of the present embodiment do not coincide with the width of the TEG pattern (see $\Delta x$ in FIG. 2(C)). When the line width (the width of each device forming region) is 0.4 µm, for example, the width of each projection of the CVD oxide film 207 might be about 0.6 µm although depending on other conditions. The polishing speed of CMP actually depends on the width of the projection of the CVD oxide film 207 without depending on the width of the device forming region. Thus, the line width may be corrected by the sizing process because the polishing speed of CMP can be controlled with a high degree of accuracy.

(9) Subsequently, the total or gross area B subsequent to the sizing process, of the device forming region lying within the reference region 300 is calculated. Then, a ratio B/A between the reference area A and the area B of the device forming region is calculated. The result of calculation B/A corresponds to an active pattern density (proportion of area occupied by device forming region) lying within the reference region 300. The active pattern density lying within the reference region 300 is referred to as "local active pattern density".

The computing process of (7) through (9) is performed for each measuring point pattern 101. As described above, the size of the reference region 300 is larger than each of most blocks 100, and the line width and space width of each block differ for each block 100. Thus, the local active pattern density also differs for each measuring point pattern 101.

(10) Thereafter, the relationship between the remaining film thickness (see above process step (6)) of each measuring pad, which has been measured in the actual measuring process and the active pattern density (refer to above process step (9)) is determined.

Figure 4:
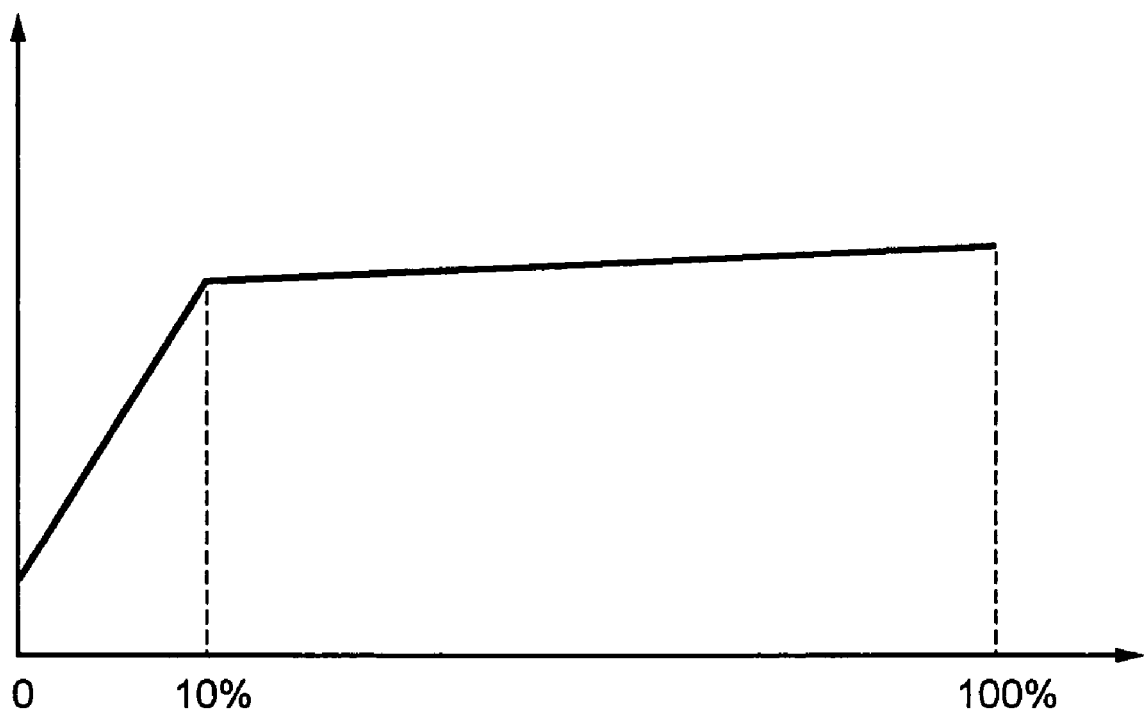
FIG. 4 is a graph showing the relationship between a result of measurement by the measuring process and a result of computation by the computing process both obtained in the first embodiment.

FIG. 4 is a graph showing the relationship between a local active pattern density and a remaining film thickness. The horizontal axis indicates the local active pattern density, and the vertical axis indicates the remaining film thickness. In the example of FIG. 4, the remaining film thickness of each CVD oxide film 207 greatly depends on the local active pattern density when the local active pattern density is less than or equal to 10%. On the other hand, when the local active pattern density is greater than or equal to 10%, the remaining film thickness does not so depend on the local active pattern density. By use of the graph shown in FIG. 4, the remaining film thickness of a CVD oxide film 207 at an arbitrary point, of a semiconductor device-actually fabricated as a product can be determined (anticipated) with high accuracy.

Here, the relationship between the local active pattern density and the remaining film thickness varies even depending on other conditions such as the shape of each pre-CMP trench, the thickness of the silicon nitride film 203, the amount of polishing by CMP, CMP conditions, the type of abrasive, etc. Also the optimum set value of the size of the reference area A also varies according to manufacturing conditions, a TEG pattern, etc. Accordingly, the measuring process may preferably be carried out after the optimum conditions have been determined in accordance with manufacturing conditions of an actually produced semiconductor device.

According to the remaining film thickness determining method in the polishing process, according to the present embodiment as described above, the relationship between the local active pattern density and the remaining film thickness can be determined using the silicon substrate 201 formed with the TEG pattern. Thus, the remaining film thickness of each CVD oxide film 207 can be judged with high accuracy even though the remaining film thickness thereof is not measured, upon actually fabricating the semiconductor device as the product.

By using the remaining film thickness determining method in the polishing process, according to the present embodiment, the minimum value of each allowed local active pattern density can be accurately recognized at a design stage. Thus, it becomes easy to design a semiconductor device high in yield and reliability while an increase in burden of design working is being suppressed.

Processing (see second and third embodiments) for suppressing the polishing of CMP is effected on a region in which the remaining film thickness of each CVD oxide film 207 becomes smaller than the allowable remaining film thickness, thereby making it possible to achieve a further reduction in the load of design and further improvements in yield and reliability.

Although the relationship between the local active pattern density and the remaining film thickness has been represented in graphical form in the present embodiment, this relationship may of course be defined by another method (e.g., a relational expression or the like).

<Second Embodiment>

One embodiment of a method of manufacturing a semiconductor device, according to a second invention will next be explained with reference to FIGS. 5A–5D and 6.

FIGS. 5A–5D are cross-sectional process views for describing a manufacturing process according to the present embodiment.

(1) A protective oxide film 502 and a silicon nitride film 503 are first formed on the surface of a silicon substrate 501 in a manner similar to the prior art (see FIGS. 8A–8D and 9A–9B). These films 502 and 503 correspond to "coated films" employed in the present invention. Subsequently, a resist pattern 504 is formed on the surface of the silicon nitride film 503, and thereafter the silicon nitride film 503, the protective oxide film 502 and the silicon substrate 501 are sequentially etched. As a result, trenches 505 are formed (see FIG. 5(A)).

(2) The resist pattern 504 is removed and thereafter an oxide film 506 is formed on an inner wall surface of each trench 505. Further, an oxide film 507 is formed by a CVD method, for example. Thus, the oxide film 507 is charged into the trenches 505 and the surface of the silicon nitride film 503 is covered with the oxide film 507 (see FIG. 5(B)). The oxide film 507 corresponds to "a buried insulating film" employed in the present invention.

(3) Subsequently, a silicon nitride film having a thickness of, for example, about 20 nm is formed on the oxide film 507. Then the silicon nitride film is patterned using the known photolithography technology. Consequently, silicon nitride film patterns 508 are formed (see FIG. 5(C)). Each of the silicon nitride film patterns 508 is formed only in a region in which the result of determination of the remaining film thickness in a polishing process (the anticipated remaining film thickness of silicon nitride film 503) is smaller than a predetermined film thickness. Each of the silicon nitride films 508 corresponds to "a polish suppressing film" employed in the present invention.

Figure 6:
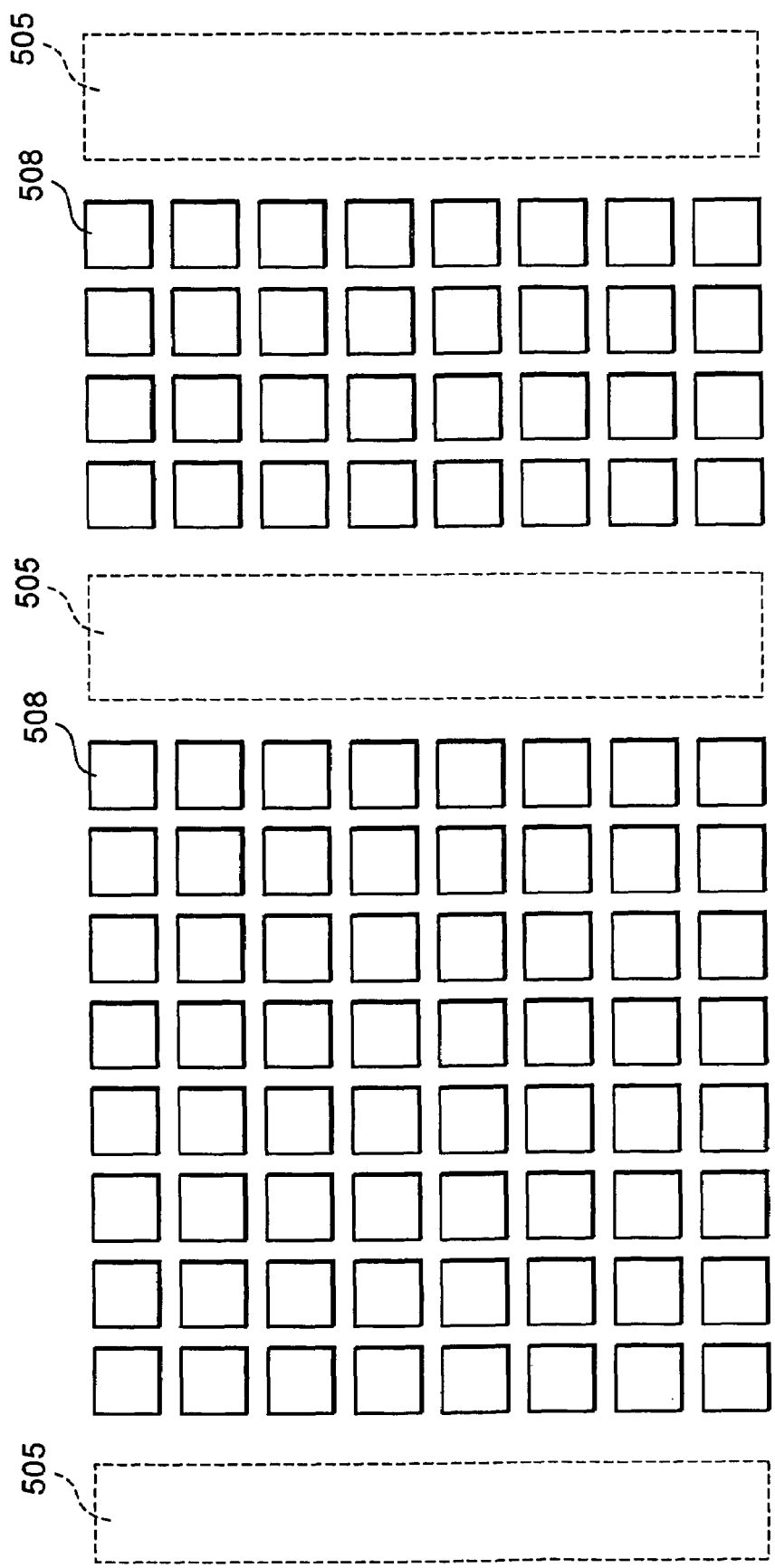
FIG. 6 is a plan view conceptually depicting a constitution of polish suppressing films according to the second embodiment.

FIG. 6 is a plan view conceptually showing the silicon nitride film patterns 508. In the example shown in FIG. 6, the silicon nitride film patterns 508 each have a size of 1 μm×1 μm and are disposed at 0.5 μm intervals.

Incidentally, although the method of determining the remaining film thickness in the polishing process is not limited in particular, the determining method (refer to the first embodiment) of the present invention can be used. When the determining method of the first embodiment is used, the silicon nitride film patterns 508 may be formed only in a region in which a local active pattern density is 10% or less (see FIG. 4).

Figure 5A:
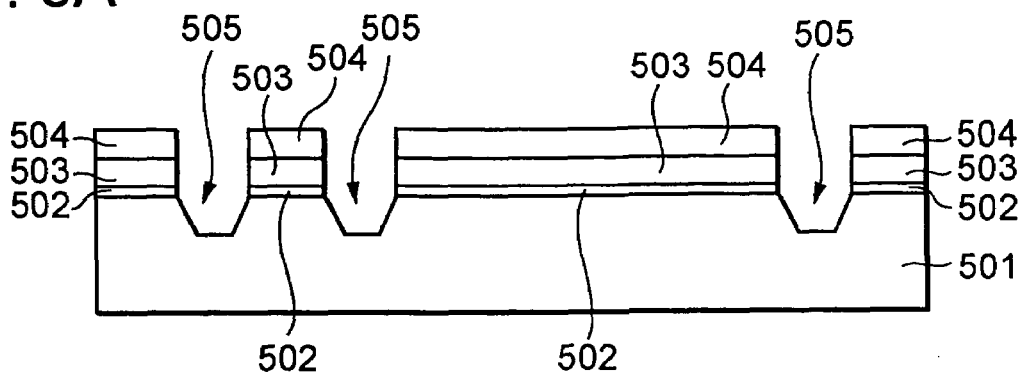
FIGS. 5A–5D are sectional process views illustrating a method of manufacturing a semiconductor device, according to a second embodiment of the present invention.
Figure 5B:
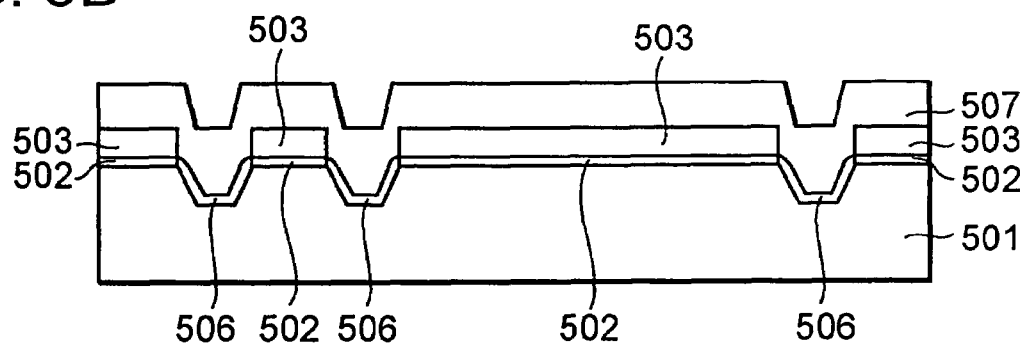
Figure 5C:
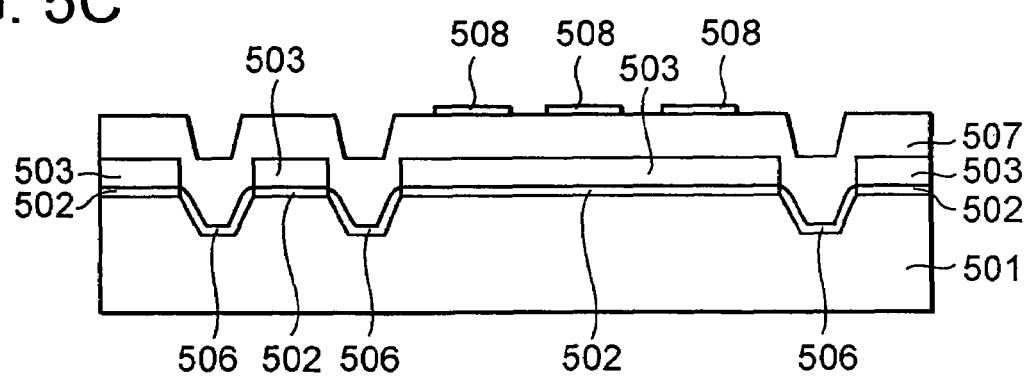
Figure 5D:
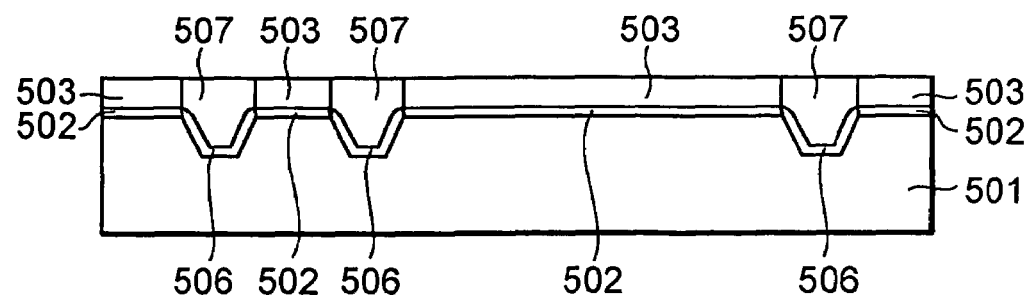

(4) Subsequently, the CVD oxide film 507 is polished until the surface of the silicon nitride film 503 is exposed by using a CMP method (see FIG. 5(D)). As an abrasive, for example, a ceria slurry may preferably be used. The above-described silicon nitride film patterns 508 are also removed by this polishing. Since the silicon nitride film patterns 508 are provided in the region in which the result of determination of the remaining film thickness in the polishing process is small, in the present embodiment, the post-polish remaining film thickness can be made uniform.

(5) Afterwards, the surface of the CVD oxide film 507 is etched in a manner similar to the prior art. Further, the silicon nitride film 503 and the protective oxide film 502 are removed.

According to the present embodiment as described above, the CVD oxide film 507 is polished after the formation of the silicon nitride film patterns 508 in the region in which the result of determination of the remaining film thickness in the polishing process is small, thus making it possible to suppress variations in the remaining film thickness of the silicon nitride film 503.

Particularly when the determining method of the present invention is used as the method of determining the remaining film thickness in the polishing process, the reliability of suppression of its variations can be made very high.

Incidentally, although the silicon nitride film patterns 508 have been used as the polish suppressing films in the present embodiment, other material films may of course be used. That is, any material films can be used as polish suppressing films by suitably setting the film thickness, size, interval and the like according to the polishing speed.

<Third Embodiment>

Another embodiment of a method of manufacturing a semiconductor device, according to a second invention will next be explained using FIG. 7.

The manufacturing method according to the present embodiment is similar to the second embodiment except for the process step (refer to the process step (3) of the second embodiment) for forming the polish suppressing films. The present embodiment is different from the second embodiment in that the proportion of area occupied by each polish suppressing film is changed according to the result of determination of the remaining film thickness in a polishing process upon forming the polish suppressing films.

Incidentally, the present embodiment will explain as an example a case in which the method of the first embodiment is used as a method of determining the remaining film thickness in the polishing process.

Figure 7:
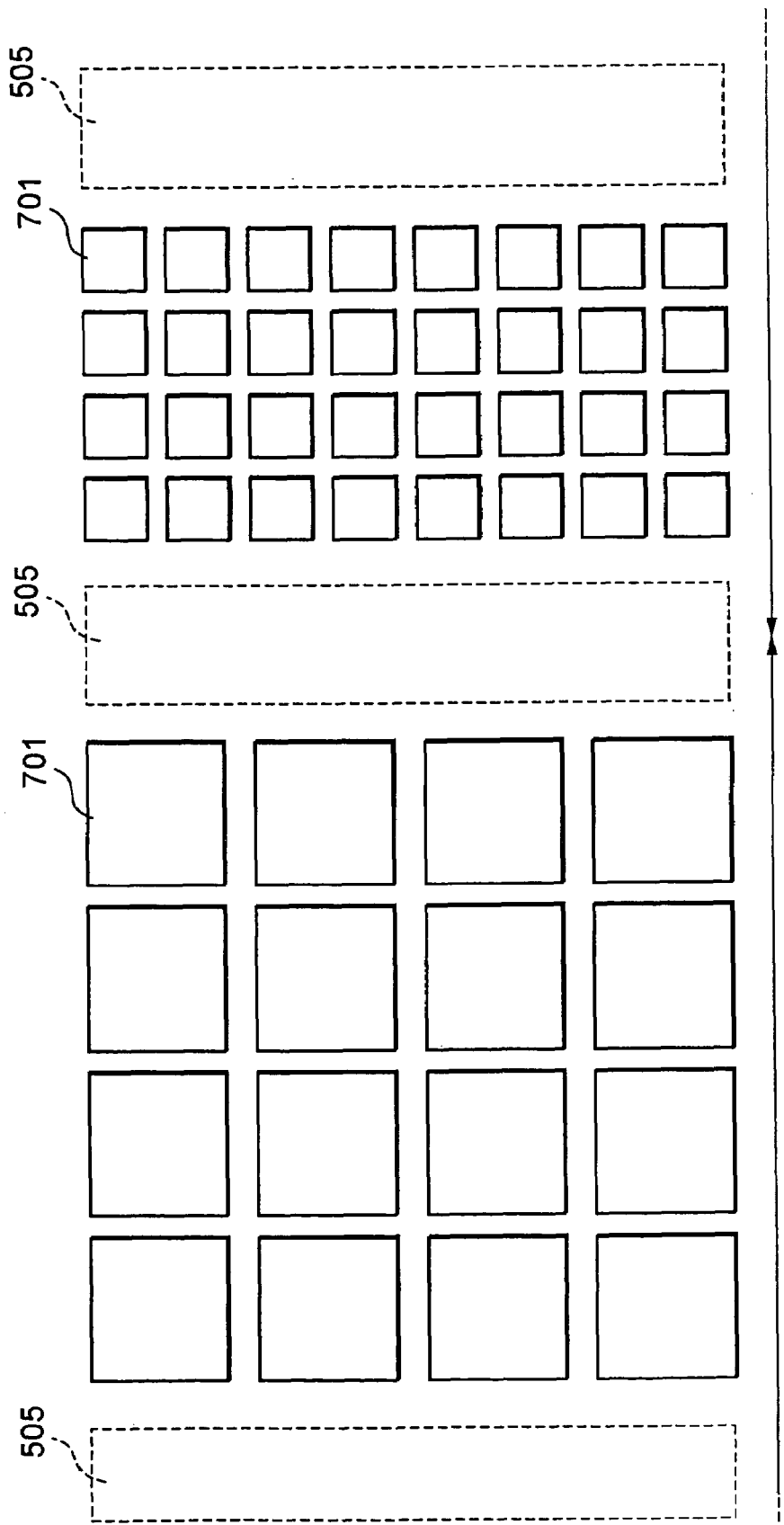
FIG. 7 is a plan view conceptually showing a constitution of polish suppressing films according to a third embodiment of the present invention.
Figure 8A:
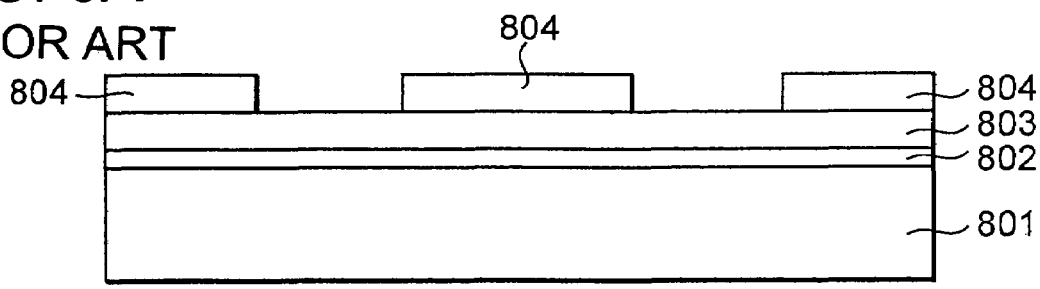
FIGS. 8A–8D are sectional process views showing an example of a conventional method of manufacturing a semiconductor device.
Figure 8B:
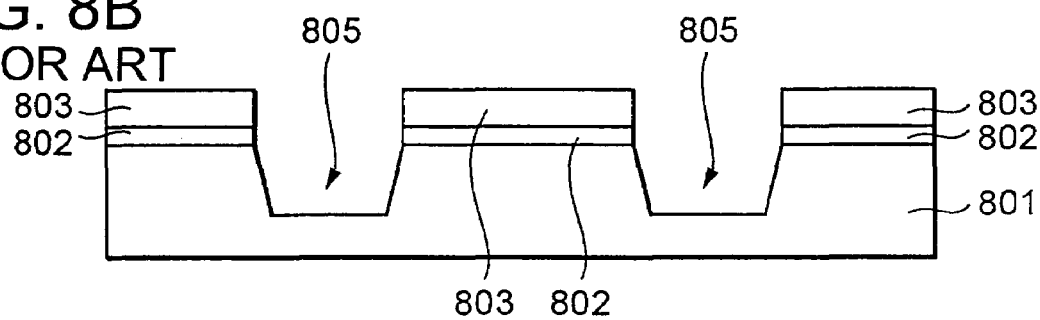
Figure 8C:
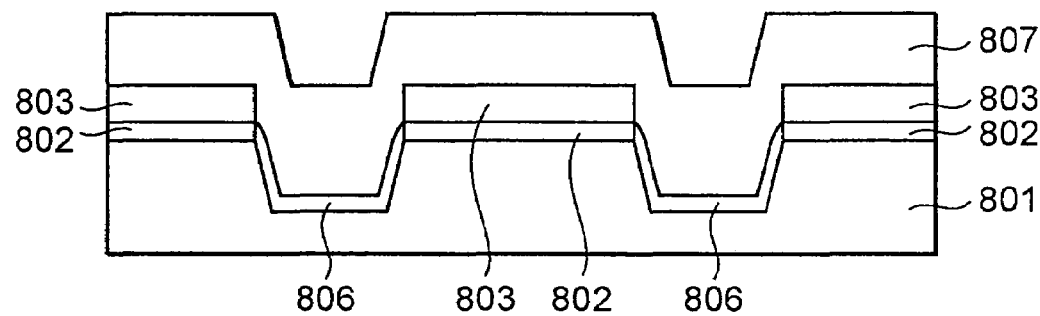
Figure 8D:
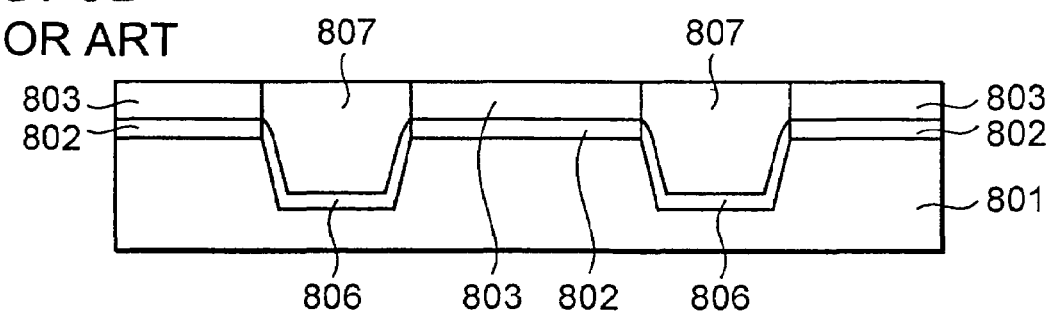
Figure 9A:
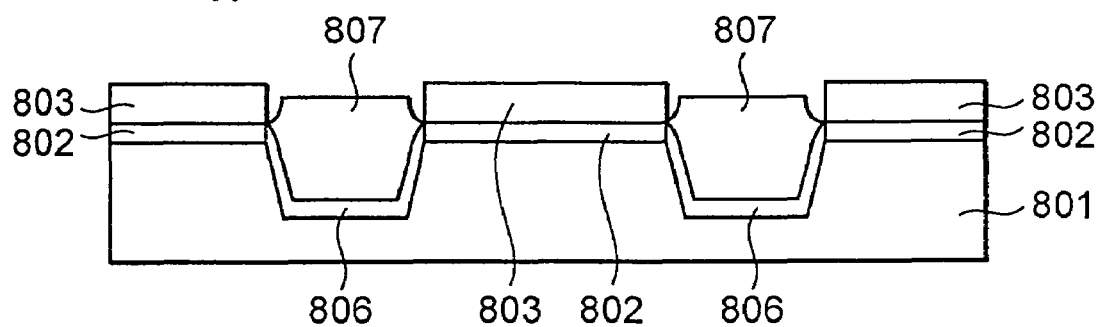
FIGS. 9A–9B are sectional process views illustrating the example of the conventional method of manufacturing the semiconductor device.
Figure 9B:
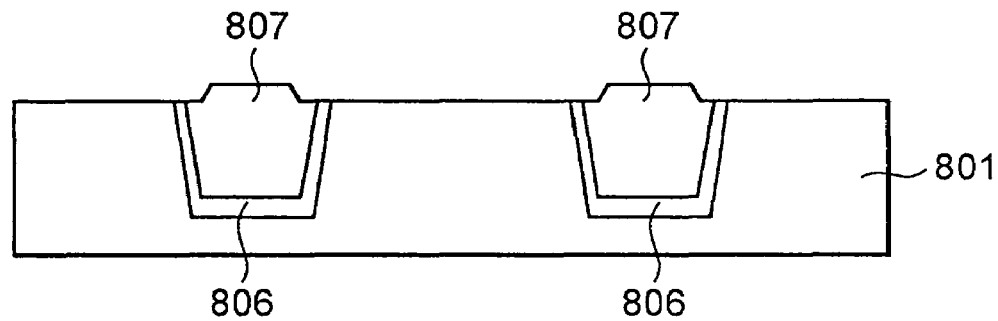

FIG. 7 is a plan view conceptually showing polish suppressing films (silicon nitride film patterns 701) according to the present embodiment.

In the example shown in FIG. 7, the size of each of the silicon nitride film patterns 701 is set to 2.5 µm×2.5 µm in a region in which a local active pattern density is less than 5%. The size thereof is set to 1 µm×1 µm in a region in which a local active pattern density ranges from over 5% to under 10%. The interval in which the silicon nitride film patterns 701 are laid out, is set to 0.5 µm regardless of the local active pattern density. Thus, the proportion of area occupied by the silicon nitride film patterns 701 results in 69.4% in the region in which the local active pattern density is less than 5% and results in 44.4% in the region in which the local active pattern density ranges from over 5% to under 10%. The third embodiment is identical to the second embodiment in that no silicon nitride film patterns 701 are provided in a region in which a local active pattern density is higher than 10%.

According to the present embodiment as described above, since the proportion of area occupied by the polish suppressing films is changed according to the result of determination of the remaining film thickness in the polishing process, variations in the remaining film thickness of the silicon nitride film 503 can be further suppressed as compared with the second embodiment.

In a manner similar to the second embodiment, the reliability of suppression of variations in the remaining film thickness can be made very high where the determining method of the present invention is used as the method of determining the remaining film thickness in the polishing process. The present embodiment is similar to the second embodiment even in that other material films can be used as the polish suppressing films.

Although the proportion of area occupied by the polish suppressing films is divided into two stages in the present embodiment, it is needless to say that it may be divided into three stages.

The present invention can be applied not only to CMP but also to a semiconductor manufacturing process using other polishing technology.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A remaining film thickness determining method employed in a polishing process, comprising:
    a measuring process including,
        a first step of forming a predetermined coated film on a semiconductor substrate;
        a second step of forming on the coated film resist patterns each having a plurality of pattern blocks including lines and spaces in which at least one of line widths and space widths are different from one another;
        a third step of etching a surface of the coated film and the semiconductor substrate with the resist patterns as masks to thereby form trenches;
        a fourth step of removing the resist patterns and thereafter forming a buried insulating film which charges interiors of the trenches and covers the surface of the coated film;
        a fifth step of polishing a surface of the buried insulating film so as to expose the surface of the coated film; and
        a sixth step of measuring remaining film thicknesses of the coated film subsequent to said fifth step, at a plurality of measuring points; and
    a computing process including,
        a seventh step of conceptually defining reference regions each having a predetermined shape and area in a surface of the semiconductor substrate, such that each of the measuring points is respectively placed in a center of a corresponding one of the reference regions;
        an eighth step of computing for each of the reference regions a ratio between an area of a corresponding reference region and a gross area of the lines lying in the corresponding reference region;
        a ninth step of determining a relationship between a result of measurement in said sixth step and a result of computation in said eighth step; and
        a tenth step of determining an anticipated remaining film thickness of the coated film at an arbitrary point of an actually fabricated semiconductor device based on the relationship determined in said ninth step.

2. The remaining film thickness determining method according to claim 1, wherein the coated film is a laminated film having a protective oxide film formed on the semiconductor substrate and a silicon nitride film formed on the protective oxide film.

3. The remaining film thickness determining method according to claim 1, wherein said fifth step is a chemical mechanical polishing process.

4. The remaining film thickness determining method according to claim 1, wherein the reference regions are defined so as to straddle the plurality of pattern blocks including the lines and the spaces.

5. The remaining film thickness determining method according to claim 1, wherein the gross area of the lines is calculated after the line widths are corrected so as to approximate convex pattern widths of the buried insulating film formed in said fourth step, and the computation of said eighth step is performed using a result of the calculation.

6. A remaining film thickness determining method employed in a polishing process, comprising:
    a measuring process including,
        forming a predetermined coated film on a semiconductor substrate;
        forming on the coated film resist patterns each having a plurality of pattern blocks including lines and spaces in which at least one of line widths and space widths are different from one another;
        etching a surface of the coated film and the semiconductor substrate with the resist patterns as masks to thereby form trenches;
        removing the resist patterns and thereafter forming a buried insulating film which charges interiors of the trenches and covers the surface of the coated film;
        polishing a surface of the buried insulating film so as to expose the surface of the coated film; and
        measuring remaining film thicknesses of the coated film subsequent to said polishing, at a plurality of measuring points; and a computing process including,
  conceptually defining reference regions each having a predetermined shape and area in a surface of the semiconductor substrate, such that each of the measuring points is respectively placed in a center of a corresponding one of the reference regions;
  computing for each of the reference regions a ratio between an area of a corresponding reference region and a gross area of the lines lying in the corresponding reference region;
  determining a relationship between a result of measurement in said measuring remaining film thicknesses and a result of said ratio computing; and
  determining an anticipated remaining film thickness of the coated film at an arbitrary point of an actually fabricated semiconductor device based on the relationship determined in said determining a relationship.

7. The remaining film thickness determining method according to claim 6, wherein the coated film is a laminated film having a protective oxide film formed on the semiconductor substrate and a silicon nitride film formed on the protective oxide film.

8. The remaining film thickness determining method according to claim 6, wherein polishing is a chemical mechanical polishing process.

9. The remaining film thickness determining method according to claim 6, wherein the reference regions are defined so as to straddle the plurality of pattern blocks including the lines and the spaces.

10. The remaining film thickness determining method according to claim 6, wherein the gross area of the lines is calculated after the line widths are corrected so as to approximate convex pattern widths of the buried insulating film formed in said removing the resist patterns, and said ratio computing is performed using a result of the calculation.

* * * * *